United States Patent
Bijnen et al.

(10) Patent No.: US 7,433,038 B2
(45) Date of Patent: Oct. 7, 2008

(54) ALIGNMENT OF SUBSTRATES FOR BONDING

(75) Inventors: Franciscus Godefridus Casper Bijnen, Valkenswaard (NL); Roy Werkman, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 356 days.

(21) Appl. No.: 11/412,112

(22) Filed: Apr. 27, 2006

(65) Prior Publication Data

US 2007/0252994 A1 Nov. 1, 2007

(51) Int. Cl.
*G01B 11/00* (2006.01)
*H01L 21/30* (2006.01)

(52) U.S. Cl. ............ 356/400; 356/401; 438/455; 438/401; 29/833

(58) Field of Classification Search ......... 356/399–401; 438/401, 455; 29/832, 833
See application file for complete search history.

(56) References Cited

U.S. PATENT DOCUMENTS

| | | | |
|---|---|---|---|
| 6,214,692 B1 | 4/2001 | Thallner | |
| 6,768,539 B2 | 7/2004 | Gui et al. | |
| 7,134,188 B2 * | 11/2006 | Fukunaga | 29/740 |
| 7,200,926 B2 * | 4/2007 | Fukunaga | 29/833 |
| 2005/0133743 A1 | 6/2005 | Schets et al. | |
| 2005/0255666 A1 * | 11/2005 | Yang | 438/401 |
| 2006/0141743 A1 * | 6/2006 | Best et al. | 438/455 |
| 2006/0172507 A1 * | 8/2006 | Best et al. | 438/455 |

OTHER PUBLICATIONS

U.S. Appl. No. 11/020,556, filed Dec. 27, 2005, Keith Frank Best.
U.S. Appl. No. 11/317,241, filed Dec. 27, 2005, Keith Frank Best.
"Light Field Photography with a Hand-held Plenoptic Camera", Stanford Tech Report CTSR 2005-02, pp. 1-11.

* cited by examiner

*Primary Examiner*—L. G Lauchman
(74) *Attorney, Agent, or Firm*—Pillsbury Winthrop Shaw Pittman, LLP

(57) ABSTRACT

An alignment apparatus for a substrate bonding system is provided with a first optical arm arranged to direct onto a detector radiation from a first alignment mark on a first substrate, and a second optical arm arranged to direct onto the detector radiation from a second alignment mark on a second substrate. The first alignment mark has a known location relative to a functional pattern provided on an opposite side of the first substrate, and the second alignment mark has a known location relative to a functional pattern provided on an opposite side of the second substrate. The substrate bonding system can be further provided with first and second substrate tables arranged to hold the first and second substrates such that they face one another, at least one of the substrate tables being movable in response to a signal output from the detector, thereby allowing the first and second substrates to be aligned with respect to each other for bonding.

20 Claims, 7 Drawing Sheets

A

B

ALIGNMENT OF SUBSTRATES FOR BONDING

BACKGROUND OF THE INVENTION

1. Field of the Invention

The present invention relates to alignment of substrates for bonding.

2. Description of Related Art

Substrate bonding is a technology used in micro-electronics fabrication, in which a first substrate carrying first devices on its surface is brought into contact with second devices on a surface of a second substrate for fabricating an electronic circuit. Typically, the contact is arranged in such a way that signals can be transported from at least one first device on the first substrate to at least one second device on the second substrate or vice versa. The signals to be transported between the first device and the second device may be either electronic, photonic, fluidic, gaseous, magnetic, or sonic, or may relate to any other conceivable type of signal. Substrate bonding is used in instances in which manufacture of a device as a single entity is too expensive, impractical, or is not possible.

An example where substrate bonding is useful in reducing costs is when Si-based first devices need to be combined with second devices based on another substrate material such as a III-V or II-VI semiconductor substrate. Manufacturing of both types of devices on a single substrate may be virtually impossible due to the incompatibility of the constituent materials.

Another example is an electronic circuit made out of a first and second substrate where, for reason of complexity, devices need to be fabricated on separate substrates (even though both substrates may be based on a similar substrate type).

In cases where an electronic circuit or "chip" needs to combine two or more devices not manufactured on a single substrate, substrate bonding can provide a way to combine those devices into a single package with a desired (electronic) function. On each device, areas are reserved for providing one or more contact pads. A contact pad is intended to provide a connection between one of the devices and a similar contact pad on the other of the devices. Typically, the location of each contact pad within the device area is defined during the design of the device or the electronic circuit of which the device is a part. The contact pads on devices to be bonded must have a sufficient alignment and overlap (i.e., a coincidence in their respective lateral positions within the device area) that a functional contact between the first and second devices is achieved; i.e., the electronic circuit formed from the devices is actually functional.

For circuits where signals other than electric signals need to be exchanged between the first and second devices, contact openings (for channels guiding the signals) may be provided instead of contact pads. In that case, the bonding operation is performed so as to align the contact openings on first and second devices with respect to each other, and thereby achieve functional contact between the first and second devices.

Conventional substrate bonding machines may provide a substrate bonding capability with a limited accuracy, typically about 100 micrometers. In order to compensate for this limited accuracy, large contact pads are provided on the first and second devices (to ensure that the contacts connect with each other when the devices are bonded together). This can be disadvantageous because the contacts take up a large amount of the available area on the substrate.

Moreover, conventional substrate bonding machines provide alignment of first and second substrates in a mechanical manner, without taking into account the locations of devices on the substrates. The mechanical alignment between substrates is assumed to coincide with the alignment of devices on the substrates. If smaller contacts were to be used, then this approach may become unacceptably inaccurate.

An alternative, currently used approach to achieve alignment is to direct infrared light through substrates, to allow inwardly facing alignment marks to be viewed. A disadvantage of this approach is that the substrate must be transparent to infrared light.

A further alternative, currently used approach to alignment is to align a first substrate using a first detector, move that substrate out of the way whilst monitoring its location, then align a second substrate to the previously measured position of the first substrate. The first substrate is then returned to its original aligned position, so that the first and second substrates are aligned relative to one another. This approach is slow and requires expensive location monitoring equipment.

BRIEF SUMMARY OF THE INVENTION

It is desirable to provide alignment for substrate bonding, in a manner which overcomes or mitigates at least one of the above disadvantages.

According to a first aspect of the invention, there is provided an alignment apparatus for a substrate bonding system comprising a first optical arm arranged to direct radiation from a first alignment mark on a first substrate onto a detector, and a second optical arm arranged to direct radiation from a second alignment mark on a second substrate onto the detector, wherein the first alignment mark has a known location relative to a functional pattern provided on an opposite side of the first substrate, and the second alignment mark has a known location relative to a functional pattern provided on an opposite side of the second substrate. The substrate bonding system may further comprise first and second substrate tables arranged to hold the first and second substrates such that they face one another, at least one of the substrate tables being movable in response to a signal output from the detector, thereby allowing the first and second substrates to be aligned with respect to each other for bonding.

According to a second aspect of the invention, there is provided an alignment method for substrate bonding comprising holding a first substrate with a first substrate table, holding a second substrate with a second substrate table, using a detector to monitor positions of an alignment mark on the first substrate and an alignment mark on the second substrate, bringing the first and second substrates together such that they may bonded to one another, whilst monitoring the positions of the first and second alignment marks.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

In the following description the term "substrate bonding" will be used generally. It will be understood that this term encompasses the bonding of wafers, as well as other suitable substrates.

Figure 1:
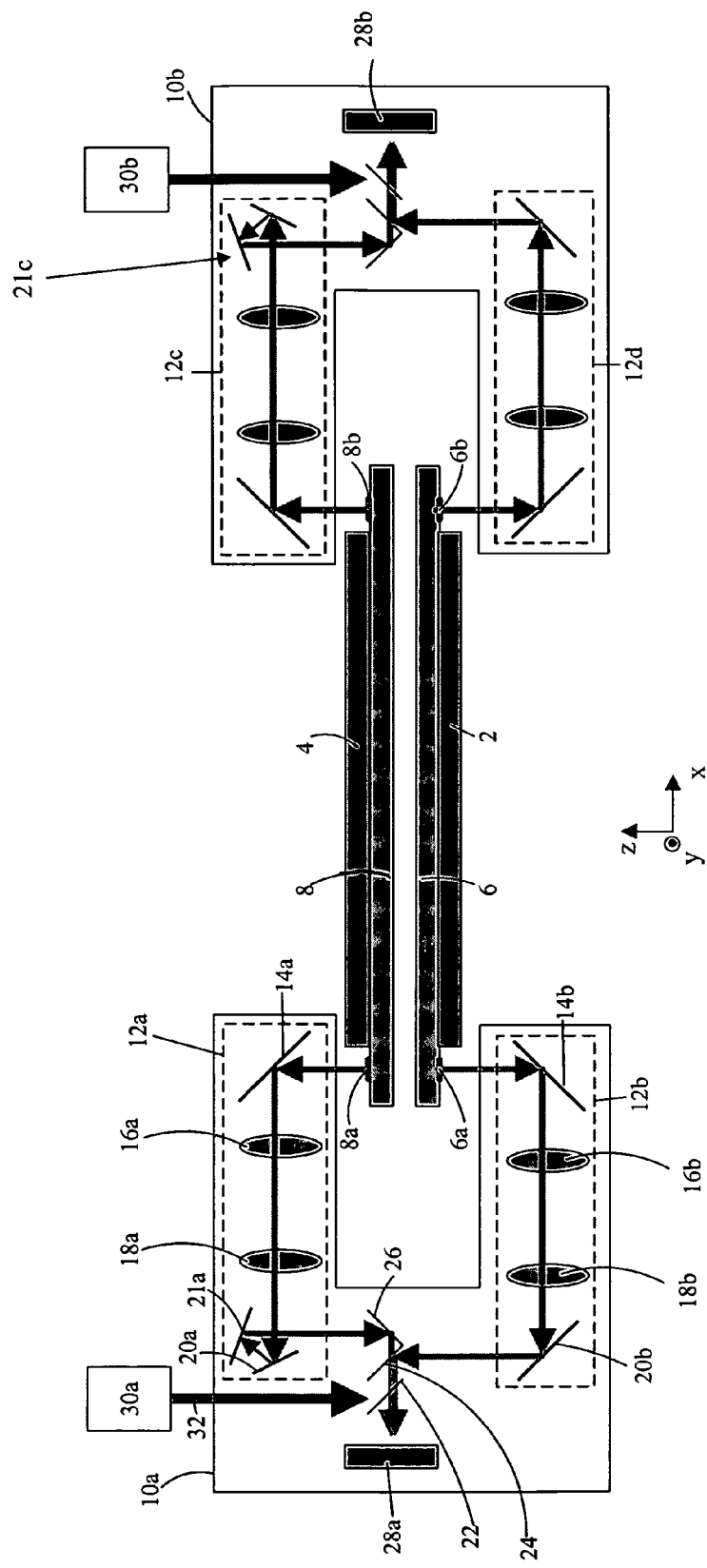
FIG. 1 shows schematically an alignment apparatus for a substrate bonding system which embodies the invention.

FIG. 1 schematically depicts an alignment apparatus for a substrate bonding system according to an embodiment of the invention. The apparatus comprises first and second substrate tables 2, 4 attached to which are first and second substrates 6, 8. Each substrate 6, 8 may be attached to its respective substrate table 2, 4 via a vacuum formed at the surface of that substrate table 2, 4, or via an electrostatic field, or via other suitable attraction mechanism.

A first alignment system 10a is provided to the left of the substrate tables 2,4. The first alignment system 10a comprises two optical arms 12a, 12b (the optical arms are indicated by broken lines). A first optical arm 12a comprises a first mirror 14a inclined at 45° relative to the substrate table 4, a pair of lenses 16a, 18a, and second and third mirrors 20a, 21a. The second and third mirrors 20a, 21a are arranged such that together they act to reflect light through 90° (the second and third mirrors may be formed, for example, by a pentaprism or equivalent). The optical arm 12a is arranged such that light from an alignment mark 8a provided on the second substrate 8 is reflected by the first mirror 14a through the first and second lenses 16a, 18a and is then reflected by the second and third mirrors 20a, 21a. The first and second lenses 16a, 18a are arranged to form an image of the alignment mark 8a optically downstream of the third mirror 21a, at a detector 28a (described further below).

A second optical arm 12b is provided beneath the first optical arm 12a. The second optical arm 12b comprises mirrors 14b, 20b, and lenses 16b, 18b. The second optical arm 12b is arranged to form an image of an alignment mark 6a optically downstream of the second mirror 20b at the detector 28a. The reason why the second optical arm 12b includes one fewer mirror than the first optical arm 12a is explained further below.

Except for the arrangements of the second and third mirrors 20a, 20b and 21a, the optics of the first and second optical arms 12a, 12b are the same. Both optical arms 12a, 12b preferably have a 4F optical system. A 4F optical system has a total optical length between image and object of 2 times the focal distance of the first lens 16a, 16b and 2 times the focal distance of the second lens 18a, 18b. An important property of a 4F system is that it easily can be made doubly telecentric. Both the first and second optical arms 12a, 12b are preferably doubly telecentric.

The alignment system 10a also includes first and second polarizing beam splitters 22, 24 and an additional mirror 26. The alignment system further comprises a detector 28a which may be, for example, a CCD camera or other imaging detector. The detector 28a may be mounted on an actuator (not shown) which allows the detector to be moved in the z and y directions. The detector 28a may be moved if the imaged alignment marks (see below) do not fall on the detector 28a.

An optical source 30a, which may be located away from the alignment system, is arranged to generate a beam of radiation 32 to be used by the alignment system 10a. The source 30a may comprise, for example, a laser, and may generate, for example, radiation at a visible or infrared wavelength (e.g., a He—Ne laser).

In use, the beam of radiation 32 is directed at the first polarizing beam-splitter 22, which directs the beam of radiation towards the second polarizing beam-splitter 24. A portion of the radiation beam 32 passes through the second polarizing beam-splitter 24, and passes via mirror 26 and the first optical arm 12a to the alignment marker 8a on the second substrate 8. Radiation is reflected from the alignment mark 8a, and passes back through the first optical arm 12a via the additional mirror 26 and through the polarizing beam splitters 22, 24 to form an image of the alignment mark on the imaging detector 28a.

A portion of the radiation beam 32 is reflected from the second polarizing beam-splitter 24, and passes through the second optical arm 12b to the alignment mark 6a provided on the first substrate 6. Radiation is reflected from the alignment mark 6a and passes back through the second optical arm 12b, and via the first and second polarizing beam splitters 22, 24 to form an image of the alignment mark 6a on the imaging detector 28a.

It will be appreciated by those skilled in the art that some loss of radiation will occur at the polarizing beam splitters 22, 24, due to radiation taking an unwanted path. For example, a portion of the radiation beam 32 may pass through the first polarizing beam-splitter 22 instead of being reflected. Quarter-wave plates and half-wave plates may be used to rotate the polarization of radiation at particular locations, thereby presenting radiation with appropriate polarizations at the polarizing beam splitters 22, 24 such that the loss of radiation due to beams traveling in unwanted directions is reduced. Suitable locations for such plates, which are sometimes referred to as $\lambda/4$ and $\lambda/2$ plates, will be apparent to those skilled in the art. In some instances, some loss of radiation still may occur (for ease of illustration, this has not been shown in FIG. 1).

As can be seen from FIG. 1, a second alignment system 10b can be provided on an opposite side of the substrate tables 2,4. The second alignment system 10b comprises third and fourth optical arms 12c, 12d. The third and fourth optical arms 12c, 12d operate in the same manner as the first and second optical arms 12a, 12b, and therefore will not be described here.

The alignment systems 10a, 10b are used to align the first and second substrates 6, 8 so that they can be accurately bonded together. Alignment marks 6a, 6b, 8a, 8b provided on outwardly facing surfaces of the substrates 6, 8 have positions which are known with respect to functional patterns provided on inwardly facing surfaces of the substrates. Thus, the substrates 6, 8 may be aligned correctly with respect to one another by aligning the images detected at the detectors 28a, 28b of the alignment systems 10a, 10b. This is achieved by moving one of the substrate tables 2, 4 with respect to the other substrate table. Either or both of the substrate tables 2, 4 may be provided with motors or other actuators arranged to allow movement in the x, y and z directions, in addition to allowing rotation about the z axis. The motors or actuators also may be arranged to allow either or both of the substrate tables 2, 4 to be tilted.

One arrangement which may be used is for one of the substrate tables 2 or 4 to be moveable in the x and y directions, and the other substrate table 2 or 4 to be moveable in the z-direction and rotatable about the z-axis.

Referring to the outwardly facing alignment marks 6a, 8a to the left side of FIG. 1, the left side alignment system 10a forms images of these two alignment marks 6a, 8a on the imaging detector 28a. The detector 28a generates an image as an output. The image shows both of the alignment marks 6a, 8a, each of which will be separately distinguishable. The lower substrate table 2 is translated in the x and/or y directions until the images of the alignment marks 6a, 8a lie on top of one another. In order for this to be achieved, the alignment marks 6a, 8a should include some symmetry, as will be described further below.

Referring to the outwardly facing alignment marks 6b, 8b to the right side of FIG. 1, the right side alignment system 10b forms images of these two alignment marks 6b, 8b on the imaging detector 28b, which generates an image as an output. The image shows both of the alignment marks, each of which will be separately distinguishable. The lower substrate table 2 is translated in the x and/or y directions until the images of the alignment marks 6b, 8b lie on top of one another.

The first optical arm 12a includes an extra mirror 21a, as compared to the second optical arm 12b, so that when both of the substrates 6, 8 are moved in the same direction along the x-axis, the imaged alignment marks 6a, 8a both move in the same direction. This property of the alignment system 10a is useful, since it ensures that movement of the substrates 6, 8 by the same distance in the x-direction does not cause the detector 28a to detect alignment mark image movement that would suggest that the alignment marks 6a, 8a are moving relative to one another. The third optical arm 12c includes an extra mirror 21c for the same reason. In general, all that is required to satisfy the requirement for correct relative movement, is that one of the optical arms 12a or 12b, or 12c or 12d of an alignment system has a number of mirrors which differs from the other optical arm by one, three or any other odd number.

It will be appreciated that the lower substrate table 2 can be moved in the x and/or y directions until alignment of both the left side and right side alignment mark pairs 6a, 8a, 6b, 8b is achieved. If it is not possible to achieve full alignment (for example, if one of the substrates 6 or 8 has expanded relative to the other), then the lower substrate table 2 will be moved to a position in which the misalignment among the alignment marks is minimized. It would be appreciated that this movement may be made automatically by a controller, based upon signals output from the imaging detectors 28a, 28b (the movement may be controlled, for example, by a microprocessor).

It will be appreciated that instead of moving the lower substrate table 2, the upper substrate table 4 may be moved. Alternatively, both substrate tables 2, 4 may be moved.

During bonding of the substrates 6, 8 (i.e., bringing the substrates 6, 8 together in the z-direction), the positions of the alignment marks 6a, 8a, 6b, 8b may be monitored by the detectors 28a, 28b. Adjustments of the positions of the substrates 6, 8 in the x and y directions may be performed as necessary, for example, if it is detected that misalignment is arising.

The embodiment of this invention depicted in FIG. 1 allows accurate bonding of substrates to be achieved via measurement of the positions of substrates 6, 8 relative to one another. It does not require that the positions of the substrates 6, 8 be measured in relation to a fixed reference point. In other words, it is not necessary that the substrates 6, 8 be accurately positioned in a specific location within the alignment apparatus (provided that the alignment marks 6a,b, 8a,b are in the field of view of the optical system). Instead, the substrates may be in any location, and the apparatus depicted in FIG. 1 can act to position correctly the substrates with respect to one another.

Although the alignment systems 10a, 10b are shown as being directly opposite from one another, it is not essential that this be the case. The alignment systems 10a, 10b generally should be more than 90° apart (measured around the circumference of one of the substrates 6, 8), since if the alignment systems 10a, 10b were to be too close to each other they might not provide sufficiently accurate alignment across the substrates 6, 8.

Although the embodiment of the invention described in relation to FIG. 1 forms images of alignment marks at an imaging detector, it will be appreciated that other suitable arrangements may be used. For example, the optical arms 12a-d may be arranged to direct light to a detector without forming images of the alignment marks, the detector being configured to view the alignment marks directly at the substrates. Similarly, it is not essential that the detector be an imaging detector. For example, the detector may comprise one or more photodiodes masked with diffraction gratings, arranged to detect light diffracted from alignment marks which include diffraction gratings.

The mirrors 14a,b, 20a,b and 21a,b referred to above may be conventional metallic mirrors, or any other suitable reflector. The same applies to other mirrors of the alignment systems 10a, 10b.

Figure 2:
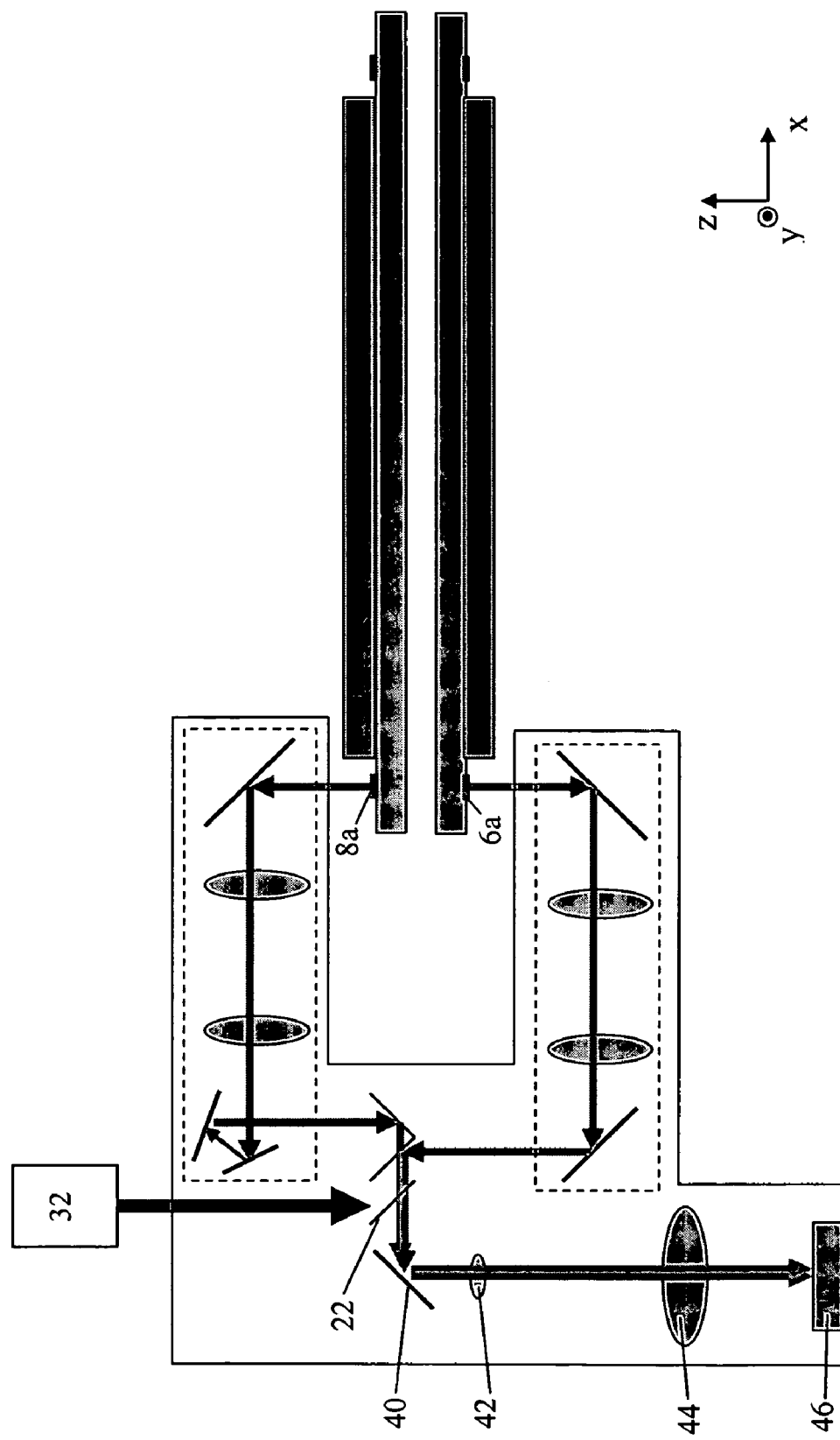
FIG. 2 shows schematically a modified version of the apparatus shown in FIG. 1.

The embodiment of the invention depicted in FIG. 1 may be modified to provide magnification of the images of alignment marks 6a, 6b, 8a, 8b. An example of such a modification is shown in FIG. 2. Since most of the apparatus shown in FIG. 2 corresponds with that shown in FIG. 1, it will not be described here. Instead only additional features are described. Rather than providing a detector adjacent to the first beamsplitter 22, a mirror 40 is provided to direct the radiation beam 32 downwardly. First and second lenses 42, 44 are arranged to provide magnification. An imaging detector 46, which may be, for example, a CCD camera, is mounted on an actuator 48 which allows the imaging detector 46 to be moved in the x and y directions.

In use, images of first and second alignment marks 6a, 8a are formed at the mirror 40, and these images are then magnified by the lenses 42, 44 onto the detector 46. If it is determined that the images of the alignment marks 6a, 8a do not fall fully within the imaging detector 46, the actuator 48 is used to translate the imaging detector 46 accordingly. The movement provided by the actuator 48 makes it possible for the imaging detector 46 to be moved to an optimal location. It will be appreciated that in some instances this may be important, since the substrates 6, 8 are not required to be in specific locations within the alignment apparatus, but instead are only required to be aligned relative to one another. This means that the images of the alignment marks 6a, 8a may fall over a significant area, the size of which is increased by the magnification of the lenses 42, 44. The actuator 48 should have a sufficient range of movement to ensure that the alignment marks 6a, 8a may be detected properly. This also applies to the actuator (not illustrated) referred to above in relation to FIG. 1.

An advantage of the configuration shown in FIG. 2 is that by magnifying the images of the alignment marks 6a, 8a the accuracy of the measurement provided by the imaging detector 46 may be increased.

It will be appreciated that a corresponding alignment system can be provided to the right side of the substrates 6, 8, and that this has been omitted for ease of illustration.

Figure 3A:
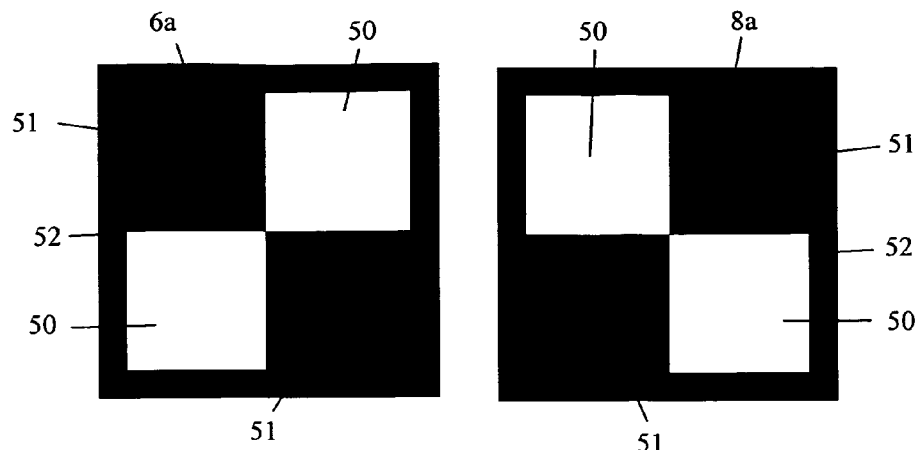
FIGS. 3a to 5c illustrate properties of alignment marks which may be used by embodiments of the present invention.

Alignment marks suitable for use with embodiments of this invention are shown in FIG. 3a. The alignment marks 6a, 8a each comprise two square reflecting regions 50 and two square non-reflecting regions 51, surrounded by a non-reflecting border 52. In use, the images of the alignment marks 6a, 8a are formed at the imaging detector (not shown in FIG. 3a). One of the images of the alignment marks 6a, 8a is inverted relative to the other, due to the effect of the mirrors in the optical arms 12. For this reason, the alignment marks 6a, 8a are mirror images of each other, with the effect that images formed at the detector have equal structures. In other words, the relative arrangement of features of the image of each mark is the same.

Overlap of the images of the alignment marks 6a, 8a may be measured and optimized by measuring the amount of 'high intensity' radiation which is incident upon the imaging detector 28. The term 'high intensity' is intended to mean intensity that is detected when alignment beam radiation reflected from both the first and second alignment marks 6a, 8a is incident on the detector.

Figure 3B:
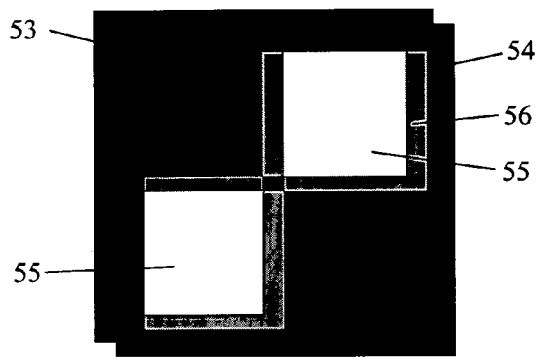

Referring to FIG. 3b, it can be seen that there is some misalignment between alignment mark images 53, 54. The images 53, 54 combine together to form regions of high intensity radiation 55, and border regions 56 with intermediate radiation intensity. By moving one of the substrates 6, 8, the area of high intensity radiation may be increased in size. Movement of the substrate will continue until the area of high intensity radiation reaches a maximum size. It would be appreciated that this movement may be controlled automatically by a controller, based upon appropriate feedback (this may be controlled, for example, by a microprocessor).

Figure 4A:
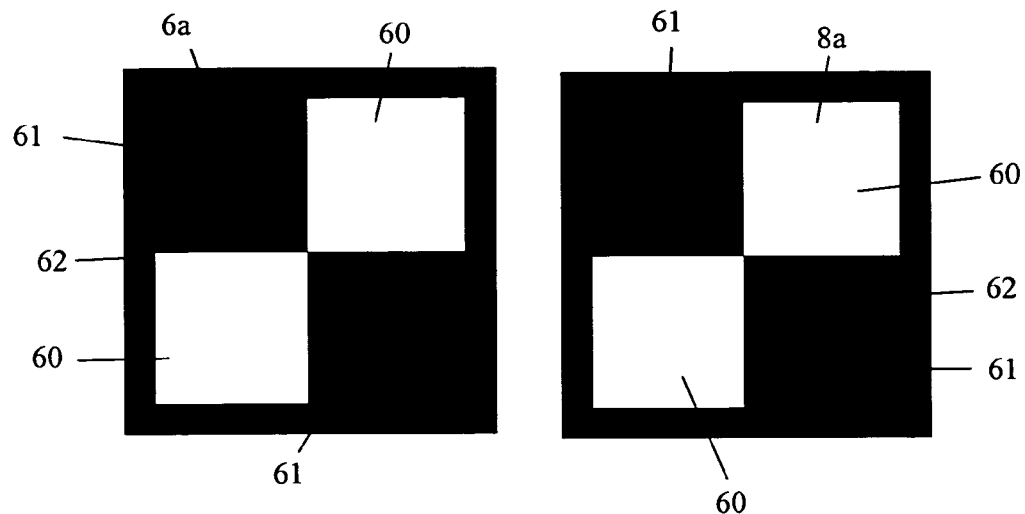
Figure 4B:
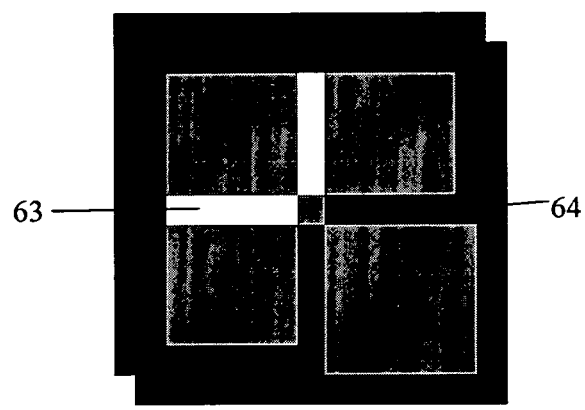

In an alternative arrangement, the intensity of the radiation in each of the optical arms 12a, 12b, (see FIG. 1) may be modulated in anti-phase. This may be achieved for example by placing suitably synchronized choppers in each of the optical arms. Overlap of the images of the alignment marks may be measured and optimized by measuring the difference signal (i.e., the modulation of radiation) which is detected by the imaging detector 28. In the example of the alignment marks shown in FIG. 4a, if the alignment marks 6a, 8a are properly aligned with one another, no significant modulation will be present in the image seen at the detector 28. Where some misalignment is present, a light region of one alignment mark 6a, 8a will overlap with a dark region of another alignment mark, with the result that modulated radiation will be seen at the detector 28. An example of misalignment between the alignment marks 6a, 8a is shown in FIG. 4b, where the grey regions indicate radiation which is not significantly modulated, the white regions indicate radiation which is significantly modulated, and the black regions indicate an absence of radiation. By moving one of the substrates 6, 8, the area of modulated radiation may be reduced in size. Movement of the substrate 6 and/or 8 will continue until the area of modulated radiation reaches a minimum size (or disappears completely). It would be appreciated that this movement may be controlled automatically by a controller, based upon appropriate feedback (this may be controlled, for example, by a microprocessor).

In an alternative arrangement, instead of providing alignment marks which form equal structures at the imaging detector, alignment may be achieved by using alignment marks which form opposite structures at the imaging detector. Referring to FIG. 4a, alignment marks 6a, 8a each comprise two square reflecting regions 60 and two square non-reflecting regions 61, surrounded by a non-reflecting border 62. The alignment marks 6a, 8a have the same structures, such that images of the alignment marks 6a, 8a formed at the imaging detector 28 will have opposite structures.

Alignment of the alignment marks 6a, 8a with respect to one another may be achieved by moving one or both of the substrates 6, 8 to minimize areas of high intensity radiation. When the images of the alignment marks 6a, 8a are correctly aligned, intermediate intensity radiation should be observed throughout the square regions of the image of the alignment mark. If it is not possible to fully eliminate areas of high intensity and low intensity, then the sizes of the areas should be minimized. This approach is illustrated in FIG. 4b, wherein the sizes of a high intensity area 63 and a low intensity area 64 are to be minimized. The movement of the substrate(s) may be automated, based upon appropriate feedback (this may be controlled, for example, by a microprocessor).

Figure 3C:
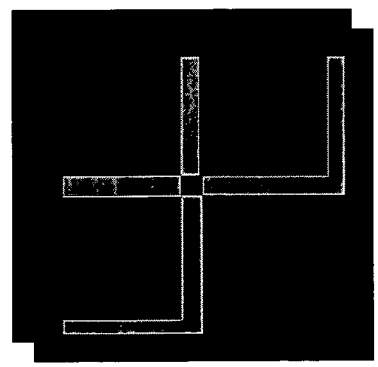
Figure 5A:
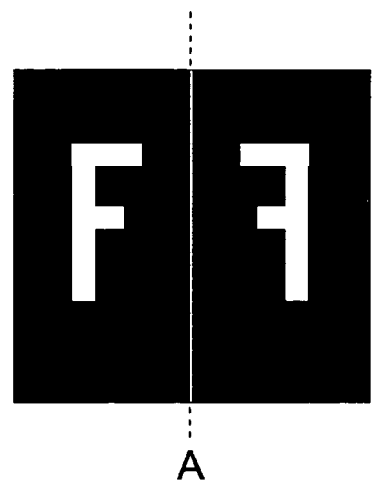
Figure 5B:
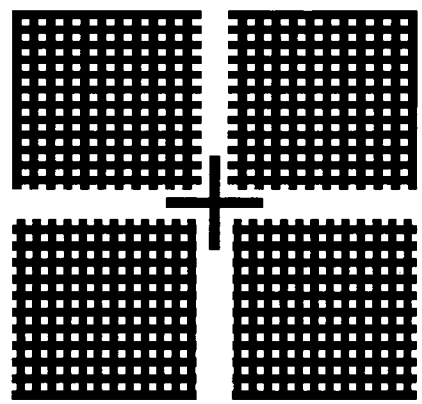
Figure 5C:
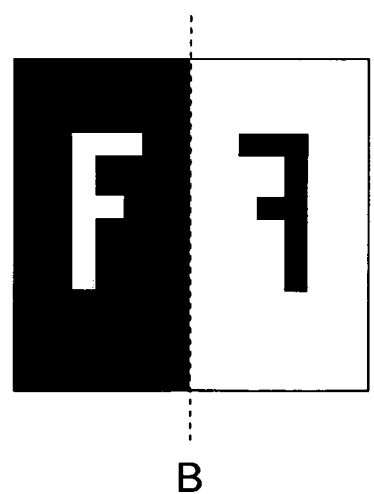

As mentioned above, due to the effect of the mirrors in the optical arms 12a-d, where it is desired to match equal structures at the imaging detector 28, the alignment marks provided on the substrates 6, 8 may have mirror symmetry. An example of mirror symmetry is shown in FIG. 5a, the axis of symmetry being labeled A. The alignment marks shown in FIG. 3a-3c have this property. A different alignment mark which has this property is shown in FIG. 5b (this alignment mark is sometimes referred to as an omni-mark). The axis of symmetry is the same as that of FIG. 5a. In an alternative arrangement, alignment marks may be opposite to one another when reflected in an axis. An example of this is shown in FIG. 5c, the axis being labeled B. The alignment marks shown in FIG. 4a have this property.

In general, it will be appreciated that any suitable alignment mark may be used: For example, the alignment mark may include diffraction patterns, or other patterns which may be usable by other alignment systems. The alignment patterns may be used, for example, by a so-called 'front-to-backside' alignment system during projection of functional patterns onto the substrates (the patterns being projected onto a side of the substrate which is opposite to the alignment mark). An example of a front-to-backside alignment system is described in U.S. Pat. No. 6,768,539.

Figure 6:
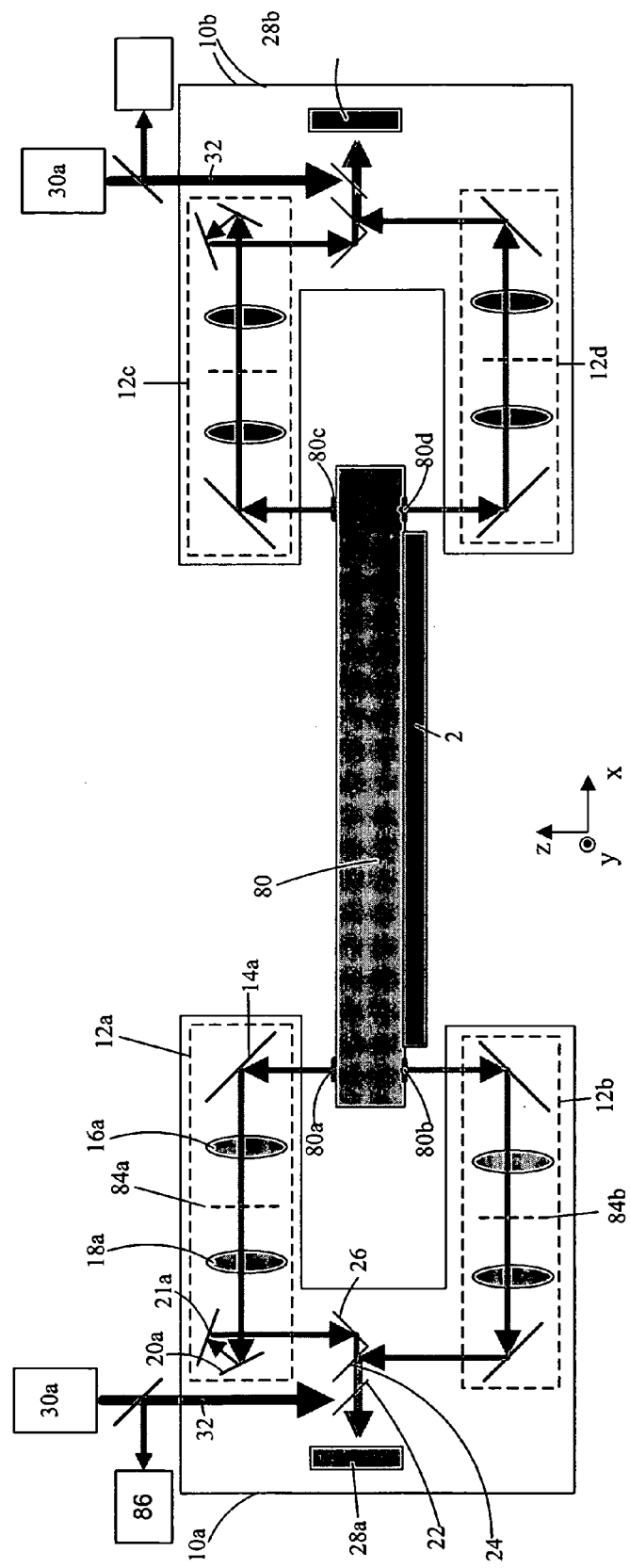
FIG. 6 schematically shows calibration of the embodiment of the invention.

FIG. 6 illustrates schematically an example of a calibration system which may be used to calibrate the alignment apparatus of FIG. 1. In one example, a calibration substrate 80 may be supported by the first substrate table 2. The calibration substrate has a thickness which is equal to the thickness of the first and second substrates 6,8 when bonded together. The calibration substrate is provided with alignment marks 80a-d. The alignment marks 80a,b provided at the left side of the calibration substrate 80 are provided at identical locations in the x and y directions (i.e. the second alignment mark 80b is located directly beneath the first alignment mark 80a). When the calibration substrate 80 is in position, the lenses and mirrors of the first alignment system 10a should form alignment mark images at the imaging detector 28a which exactly overlap with one another (or align with one another if the alignment marks have opposite structures). If this is not the case, the lenses and/or mirrors are adjusted accordingly.

Alignment marks 80c, 80d at a right hand end of the calibration substrate 80 are used in the same manner.

The reason for providing a calibration substrate which has a thickness equal to the thickness of the two substrates 6, 8 when bonded together, is that the separation in the z-direction of alignment marks for which the calibration has been determined corresponds with the separation of the substrates 6,8 as they come into contact with one another during bonding. In other words, the alignment of the first and second substrates 6, 8 could be incorrect when the substrates are spaced apart from one another, but this is unimportant provided that the substrates are properly aligned when they come into contact with one another. Performing a calibration with a calibration substrate 80 having the appropriate thickness ensures that this is the case.

It will be appreciated that the calibration substrate 80 may be of a different thickness, or that bonding of substrates with different thicknesses may be performed. Where this is the case, it may be desired during calibration to ensure that the radiation beam 32 is properly perpendicular when incident upon the calibration substrate 80 (and the first and second substrates).

One way in which orientation of the radiation beam 32 can be checked is by reflecting the radiation beam 32 from the calibration substrate 80, and using a detector 86 adjacent to the optical source 30a to detect the position of the radiation beam 32. Alternatively, if the source 30a is a laser, the principle of auto-reflection may be used, instead of using the detector 86. This comprises monitoring the spot-size and/or stability of the laser beam. If the radiation beam 32 is perpendicular when incident upon the calibration substrate 80, then it will be reflected back into the laser and will cause the spot-size of the laser to increase and/or the laser to become slightly unstable.

The orientation of the radiation beam 32 is checked for each optical arm 12a-d. This measurement assumes that the calibration substrate 80 is flat and perpendicular to the radiation beam 32. A further calibration measurement may be performed in the absence of the calibration substrate 80, the radiation beam 32 passing through one optical arm 12a and then a second optical arm 12b, before being incident on the detector 86.

An alternative manner in which calibration may be achieved is via the use of conjugate marks 84a, 84b respectively located between lens pairs 16a, 18a, and between lens pairs 16b, 18b of the optical arms 12a, 12b. The conjugate alignment marks 84a, 84b are Fourier transforms of alignment marks (for example of the types shown schematically in FIG. 3 or FIG. 4), and are located in the field planes of the lenses 16a, 18a, 16b, 18b. When the conjugate marks are in place, the lenses and/or mirrors downstream of the conjugate marks 84a, 84b are adjusted such that alignment mark images formed at the imaging detector 28a are aligned with one another. One this has been completed, the conjugate alignment marks 84a, 84b are retracted such that they are not imaged on the imaging detector 28a during substrate bonding.

It will be appreciated that, instead of adjusting the lenses and/or mirrors to make the alignment mark images overlap, the separation between alignment mark images measured at the imaging detector 28a may be recorded and taken into account as a calibrated offset during subsequent substrate bonding.

Although calibration has been described for the left hand alignment system 10a, it will be appreciated that corresponding calibration may be performed for the right hand alignment system 10b.

Figure 7A:
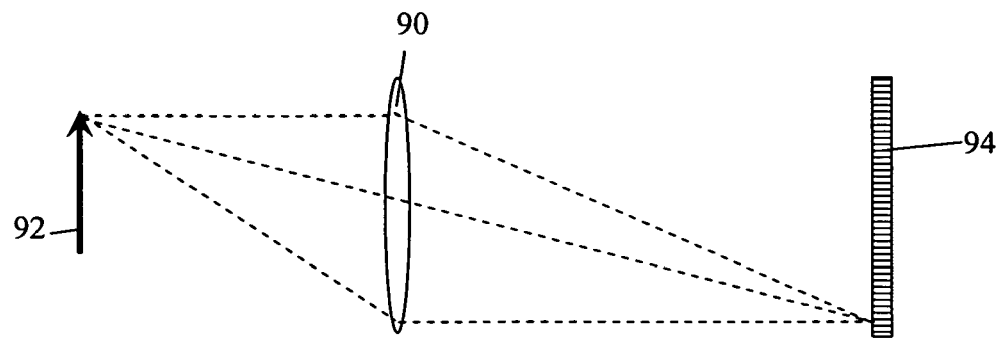
FIG. 7 illustrates plenoptic imaging, which may be used by the embodiment of the invention.
Figure 7B:
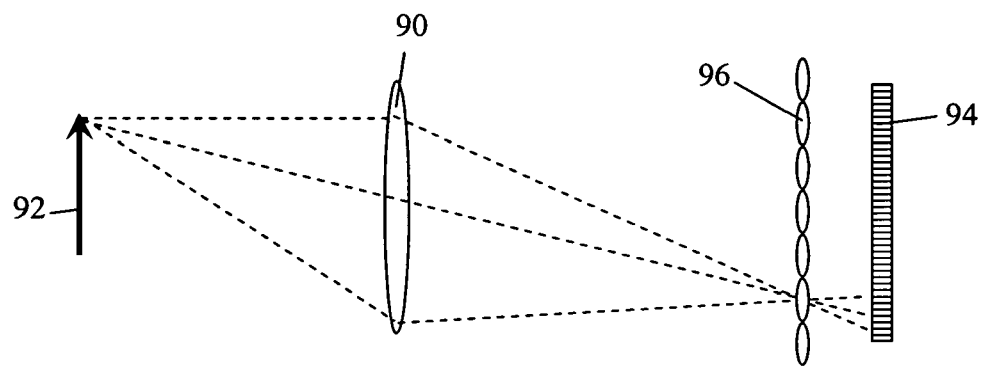

Due to movement of the substrates 6, 8 in the z-direction, it may be the case that the alignment mark images formed at the imaging detector 28a do not remain in focus. The alignment system 10a may be set up such that the alignment marks are in focus when the substrates 6, 8 come into contact with one another. The focus depth of the alignment system 10a will depend upon its effective aperture. Increasing the focus depth by reducing the aperture may lead to a reduction of the intensity of radiation incident upon the imaging detector 28a, which may reduce the accuracy of measurements made using the imaging detector 28a. This issue may be addressed by providing a microlens array adjacent to the imaging detector. The effect of such a microlens array will be described in relation to FIGS. 7a and 7b. Referring to FIG. 7a, in the absence of a microlens array, a lens 90 forms an image of an object at 92 at an imaging detector 94. Referring to FIG. 7b, a microlens array 96 may be located in the focal plane of the lens 90, and thereby form an array of images on the imaging detector 94. The distortion depends upon the manner in which radiation travels through the aperture of the lens 90. The resolution of the imaging detector 94 is selected to be higher than that of the microlens array 96, and this allows the distortion to be sampled. Using appropriate mathematics, the distortion can be translated to depth information relating to the object 92. In general, using the microlens array 96 in this manner ensures that information which would ordinarily be lost, due to the object 92 not being focused upon the imaging detector 94, is retained. Thus, the useful focal depth of the alignment optics 10a, 10b is increased substantially by providing a microlens array (not shown in FIGS. 1, 2 or 6) adjacent to the imaging detector 28a, 28b. The microlens array 96 may be positioned such that the imaging detector 28a, 28b is at the focal depth of the microlenses. In addition, the f-number of the microlens array 96 may be matched with the f-number of the optical arms with which it is associated (where the f-number of an optical arm is the diameter of the lens 18a, 18b closest to the microlens array 96, divided by the distance between that lens and the microlens array 96).

This technique is known as plenoptic imaging. A description of plenoptic imaging, including appropriate mathematics to be used to correct for measured distortion, may be found at:

http://graphics.stanford.edu/papers/lfcamera/lfcamera-600dpi.pdf

In addition to providing a greater focus depth (without loosing signal strength), plenoptic imaging reduces sensitivity to focus difference when moving substrates towards one another. Furthermore, plenoptic imaging avoids the need to perform calibrations with calibration substrates of different thicknesses, thereby reducing the amount of time needed to perform calibrations (time spent during calibration is lost manufacturing time and is therefore expensive).

The descriptions above are intended to be illustrative, not limiting. Thus, it will be apparent to one skilled in the art that modifications may be made to the invention as described without departing from the scope of the claims set out below.

What is claimed is:

1. An alignment apparatus for a substrate bonding system comprising:
   a first optical arm arranged to direct onto a detector radiation from a first alignment mark on a first substrate; and
   a second optical arm arranged to direct onto the detector radiation from a second alignment mark on a second substrate,
   wherein the first alignment mark has a known location relative to a functional pattern provided on an opposite side of the first substrate, and
   wherein the second alignment mark has a known location relative to a functional pattern provided on an opposite side of the second substrate,
   the substrate bonding system further comprising first and second substrate tables arranged to hold the first and second substrates such that said first and second substrates face one another, at least one of the substrate tables being movable in response to a signal output from the detector, thereby allowing the first and second substrates to be aligned with respect to each other for bonding.

2. The apparatus of claim 1, wherein the first and second optical arms include lenses which are arranged to form images of the first and second alignment marks.

3. The apparatus of claim 1, wherein the detector is an imaging detector.

4. The apparatus of claim 1, wherein the first and second substrate tables are both moveable.

5. The apparatus of claim 4, wherein the first substrate table is moveable in x and y orthogonal directions, and the second substrate table is movable in a z-direction orthogonal to the x and y directions and is rotatable about a z-axis.

6. The apparatus of claim 1, wherein the system further comprises actuators arranged to move at least one of the substrate tables.

7. The apparatus of claim 1, wherein the detector is mounted on an actuator, to allow the detector to be moveable transverse to the direction of radiation incident upon the detector in use.

8. The apparatus of claim 1, wherein the system is provided with magnification optics.

9. The apparatus of claim 8, wherein the magnification optics are provided in the optical arms.

10. The apparatus of claim 1, wherein the optical arms are provided with reflectors that direct the radiation onto the detector, one of the optical arms including an odd number of additional reflectors as compared to the other optical arm, the reflectors being configured such that movement of the substrates in one direction causes radiation from both of the alignment marks to move in a same direction across the detector.

11. The apparatus of claim 1, wherein the system further comprises third and fourth optical arms having features that correspond with those in the respective first and second optical arms.

12. The apparatus of claim 1, wherein the first and second optical arms include lenses that are arranged to form images of the respective first and second alignment marks, and the detector is an imaging detector arranged to view images of the first and second alignment marks, wherein the system further comprises a controller arranged to move at least one of the substrate tables based upon a signal output from the imaging detector.

13. The apparatus of claim 12, wherein the controller is configured to move at least one of the substrate tables until a measured overlap between images of the first and second alignment marks is determined to have reached a maximum.

14. The apparatus of claim 3, wherein a microlens array is provided adjacent to the imaging detector.

15. The apparatus of claim 14, wherein the imaging detector is at a focal depth of microlenses of the microlens array.

16. The apparatus of claim 2, wherein conjugate alignment marks are retractably provided in field planes of the optical arms, for use during calibration of the optical arms.

17. The apparatus of claim 1, wherein the system further comprises a radiation source, and a beam-splitter arranged to direct the radiation into the first and second optical arms.

18. An alignment method for substrate bonding, comprising:
holding a first substrate with a first substrate table;
holding a second substrate with a second substrate table;
using a detector to monitor positions of an alignment mark on the first substrate and an alignment mark on the second substrate; and
bringing the first and second substrates together such that they may bond to one another, while monitoring the positions of the first and second alignment marks.

19. The method of claim 18, further comprising adjusting relative positions of the first and second substrate tables to maintain alignment between the first and second substrates while bringing the first and second substrates together.

20. A method of calibrating an alignment system, the method comprising:
providing a calibration substrate having alignment marks at corresponding locations on opposite faces; and
adjusting optics of at least one optical arm until the images of the alignment marks align with one another,
wherein said at least one optical arm is provided as part of the alignment system, together with a second optical arm, and wherein said at least one optical arm and the second optical arm include lenses which are arranged to form images of respective first and second ones of the alignment marks.

* * * * *